US009666407B2

(12) United States Patent
Oh et al.

(10) Patent No.: US 9,666,407 B2
(45) Date of Patent: May 30, 2017

(54) ELECTROSTATIC QUADRUPOLE DEFLECTOR FOR MICROCOLUMN

(71) Applicants: Tae Sik Oh, Cheonam-si (KR); Ho Seob Kim, Incheon (KR); Dae Wook Kim, Seongnam-si (KR)

(72) Inventors: Tae Sik Oh, Cheonam-si (KR); Ho Seob Kim, Incheon (KR); Dae Wook Kim, Seongnam-si (KR)

(73) Assignee: INDUSTRY-UNIVERSITY COOPERATION FOUNDATION SUNMOON UNIVERSITY, Asan-si, Chungcheongnam-Do (KR)

( * ) Notice: Subject to any disclaimer, the term of this patent is extended or adjusted under 35 U.S.C. 154(b) by 0 days.

(21) Appl. No.: 14/631,330

(22) Filed: Feb. 25, 2015

(65) Prior Publication Data
US 2016/0247659 A1    Aug. 25, 2016

(51) Int. Cl.
H01J 37/147    (2006.01)
H01J 37/073    (2006.01)
H01J 37/26    (2006.01)
H01J 9/02    (2006.01)

(52) U.S. Cl.
CPC ............ *H01J 37/1477* (2013.01); *H01J 9/02* (2013.01); *H01J 37/073* (2013.01); *H01J 37/26* (2013.01); *H01J 2237/04924* (2013.01); *H01J 2237/1516* (2013.01)

(58) Field of Classification Search
CPC .......... H01J 37/28; H01J 37/10; H01J 37/147; H01J 37/1477; H01J 37/26; H01J 37/073; H01J 2237/1205; H01J 2237/1516; H01J 2237/151
See application file for complete search history.

(56) References Cited

U.S. PATENT DOCUMENTS

| | | | | | |
|---|---|---|---|---|---|
| 5,245,194 | A | * | 9/1993 | Oae | B82Y 10/00 250/396 R |
| 5,600,146 | A | * | 2/1997 | Felker | H01J 37/1477 250/396 R |
| 6,125,522 | A | * | 10/2000 | Nakasuji | H01J 9/236 29/458 |
| 6,218,664 | B1 | * | 4/2001 | Krans | H01J 37/28 250/310 |

(Continued)

FOREIGN PATENT DOCUMENTS

| KR | 2007214359 A | 8/2007 |
|---|---|---|
| KR | 10-1415745 A | 7/2014 |

OTHER PUBLICATIONS

Mulder, E.H., "A Microwave eight-pole transmission line deflector for 100 keV electrons" J. Vac. Sci. Technol. B 9 (6) 1991.*

(Continued)

*Primary Examiner* — Wyatt Stoffa
(74) *Attorney, Agent, or Firm* — John K. Park; Park Law Firm

(57) ABSTRACT

Disclosed is an electrostatic quadrupole deflector for a microcolumn. The deflector includes an electron beam passage hole, deflecting electrodes to which a deflection voltage is applied, and floating electrodes to which the deflection voltage is not applied. The deflector is structurally stable and has a simple driving system. The deflector has good performance and characteristics.

14 Claims, 5 Drawing Sheets

(56) References Cited

U.S. PATENT DOCUMENTS

| | | | | |
|---|---|---|---|---|
| 6,288,401 B1 * | 9/2001 | Chang | | H01J 29/54 250/396 R |
| 6,495,841 B1 * | 12/2002 | Ando | | B82Y 10/00 250/398 |
| 6,797,953 B2 * | 9/2004 | Gerlach | | B82Y 10/00 315/13.1 |
| 6,885,001 B2 * | 4/2005 | Ose | | H01J 37/147 850/9 |
| 6,946,654 B2 * | 9/2005 | Gerlach | | H01J 37/141 250/306 |
| 8,822,919 B2 * | 9/2014 | Kimba | | G01N 23/225 250/305 |
| 2002/0024013 A1 * | 2/2002 | Gerlach | | H01J 37/141 250/311 |
| 2003/0141462 A1 * | 7/2003 | Hartley | | B82Y 10/00 250/492.23 |
| 2004/0099811 A1 * | 5/2004 | Choi | | B82Y 10/00 250/396 R |
| 2004/0217299 A1 * | 11/2004 | Choi | | B82Y 10/00 250/491.1 |
| 2006/0131752 A1 * | 6/2006 | Kim | | B82Y 10/00 257/758 |
| 2007/0181819 A1 * | 8/2007 | Sanmiya | | B82Y 10/00 250/396 R |
| 2008/0258060 A1 * | 10/2008 | Frosien | | H01J 37/1478 250/310 |
| 2010/0320382 A1 * | 12/2010 | Almogy | | H01J 37/05 250/307 |
| 2014/0224997 A1 * | 8/2014 | Oh | | H01J 3/14 250/396 R |
| 2014/0224999 A1 * | 8/2014 | Noguchi | | H01J 37/12 250/396 R |
| 2014/0239190 A1 * | 8/2014 | Oh | | H01J 37/1471 250/396 R |
| 2015/0041643 A1 * | 2/2015 | Li | | H01J 37/28 250/307 |
| 2015/0076988 A1 * | 3/2015 | Plettner | | H01J 37/285 313/377 |
| 2015/0325403 A1 * | 11/2015 | Maazouz | | H01J 37/04 250/396 R |

OTHER PUBLICATIONS

Saini, R., et al., "Maufacturable Mems miniSEMs" Microelectronic Engineering 83 (2006) 1376-1381.*

* cited by examiner (a)  (b)

(a)            (b)            (c)

(a)            (b)            (c)

Electron Lens     Deflector           Target

ELECTROSTATIC QUADRUPOLE DEFLECTOR FOR MICROCOLUMN

BACKGROUND OF THE INVENTION

Field of the Invention

The present invention relates to a deflector for a microcolumn and, more particularly, to an electrostatic quadrupole deflector.

Description of the Related Art

Currently, microcolumns are applied to devices that use an electron beam, such as electron microscopes, as well as to manufacturing equipments or testers that are used in semiconductor or display industry.

FIG. 1 is a perspective view showing the structure of a micro-electron optical column according to a related art. The micro-electron optical column (also referred to as microelectron column) includes an electron emission source 110, a source lens 120 including four electrodes 121, 122, 123, and 124, a deflector 130, and a focusing lens 140 including electrodes 141, 142, and 143. The electrodes have respective electron passage holes 121a, 122a, 123a, 124a, 141a, 142a, and 143a. The source lens 120 and the focusing lens (or einzel lens) 140 each include two or more electrodes as needed. The deflector system 130 that is driven by an electrostatic field and is composed of two rows of deflectors, an upper deflector 131 and a lower deflector 132. This deflector typically has an octupole structure composed of eight electrodes. The deflector system 130 may also be composed of one or more deflectors 131 and 132 as necessary. FIG. 1 shows an example in which an octupole deflector is used. An electron beam emitted by the microcolumn is scanned to a target T.

FIGS. 2 to 4 show examples of the structures of microcolumns in which an electrostatic octupole deflector according to a related art is used.

FIGS. 5A and 5B are a plan view and a side view that illustrate an octupole deflector according to a related art. With reference to FIGS. 5A and 5B, the fabrication process of a micro electro-mechanical system (MEMS) for an octupole deflector will be described in brief. First, a silicon wafer is dipped in KOH solution so that the silicon wafer is thinned to have a thickness of several hundred micrometers. Next, electrode patterns are formed on the silicon wafer through optical lithography. Next, deep reactive ion etching is performed on the silicon wafer to form eight symmetrical electrodes 1-1', 1-2', 1-3', 1-4', 1-5', 1-6', 1-7', and 1-8' that are identical in size, arc-shaped, and are weakly connected to a portion that is to become an electron beam passage hole. An arc angle θ of each electrode of the deflector is 45°. Next, the silicon wafer is fixed to a Pyrex substrate in which an electron beam passage hole "a" is formed through an anodic bonding process. Next, unnecessary portions that are connected to the eight electrodes are removed, leaving an octupole deflector that is structurally stable. The octupole deflector may also be formed by an alternative fabrication process. That is, a silicon wafer, which is thinned to a thickness of several hundred micrometers, is first fixed to a Pyrex substrate in which an electron beam passage hole is formed through anodic bonding; electrode patterns are subsequently formed on the silicon wafer through optical lithography; and the silicon wafer is finally etched by deep reactive etching. According to the latter fabrication process, the octupole deflector can be fabricated more easily.

In the microcolumn according to the related art shown in FIG. 1, the deflector is located at a preceding stage to the einzel lens that serves as the focusing lens. Therefore, in order to increase the size of effective deflection field by causing an electron beams to pass through a center portion of the einzel lens when an electron beam is deflected, it is necessary to use a double octupole deflector system composed of deflectors 131 and 132. In this case, a predetermined deflection voltage is applied to the electrodes 1-1' to 1-8' of the octupole deflector shown in FIGS. 5A and 5B. Accordingly, in the case of the octupole structure, a complex circuitry algorithm is needed to drive a deflector system.

Alternatively, in the case of the deflectors 131 and 132 shown in FIG. 2, the deflector 131 shown in FIG. 3, and the deflector 130 shown in FIG. 4, only one octupole deflector may be used for deflection of an electron beam. In this case, in the structure of the deflector shown in FIG. 3, a deflection voltage is applied to only upper, lower, left, and right electrodes 1-1', 1-3', 1-5', and 1-7' of the octupole deflector and the other electrodes 1-2', 1-4', 1-6', and 1-8' are grounded.

In the case of the deflector 131 shown in FIG. 3 and the deflector 130 shown in FIG. 4, a conventional quadrupole deflector having a simple driving system may be used instead of an octupole deflector. In this case, although the number of electrodes is four, that is, the structure of the quadrupole deflector is simpler compared to an octupole deflector, when the quadrupole deflector is fabricated in the same method as an octupole deflector, the size of gaps between electrodes is larger in the quadrupole deflector, thus handling deformation easily occurs during the following process: forming of the symmetric identical four electrodes to be weakly connected to a portion in which an electron beam passage hole is to be formed later; fixing of the electrodes to a Pyrex substrate in which the electron beam passage holes is formed, through anodic bonding.

The term "effective deflection field size" means the size of a deflection field that ranges from the center of a target to a position at which the spot size of a deflected electron beam is 20% larger than the spot size of a non-deflected electron beam at the center of the target. In typical electron optical deflection systems, the spot size of an electron beam increases at a sharp rate as an electron beam spot becomes closer to the periphery of a target due to a difference in geometric focal distance that changes from the center to the periphery of the target and distortion of an electron beam that is attributable to spherical aberration of an electron lens that is caused by electric field. The increase in the spot size results in deterioration in resolution, causing a decrease in effective deflection field size. Therefore, it is urgent to minimize the distortion of a deflected electron beam.

DOCUMENTS OF RELATED ART

Patent Documents (Patent Document 1) Korean Patent No. 10-1415745 (registered as of Jun. 30, 2014)

(Patent Document 2) Korean Patent No. 10-1405357 (registered as of Jun. 2, 2014)

(Patent Document 3) Korean Patent No. 10-1417603 (registered as of Jul. 1, 2014)

SUMMARY OF THE INVENTION

Accordingly, the present invention has been made keeping in mind the above problems occurring in the related art, and an object of the present invention is to improve a deflection characteristic of a deflector. Another object of the present invention is to provide a structure of a deflector that can be more easily fabricated using a conventional fabrication method and that can increase an effective deflection field size. A further object of the invention is to provide a method for driving a deflector having the same structure.

In order to accomplish the objects of the invention, one aspect provides an electrostatic quadrupole deflector for a microcolumn, including: an electron beam passage hole; a plurality of arc-shaped deflecting electrodes that is arranged in a radial pattern to deflect or scan electrons that pass through the electron beam passage hole; and floating electrodes to which a deflection voltage is not applied while the deflection voltage is applied to the deflecting electrodes.

The deflecting electrodes may be smaller than the floating electrodes.

The deflecting electrodes may be composed of four deflecting electrodes that are symmetrically arranged and the floating electrode may be composed of four floating electrodes that are symmetrically arranged.

An arc angle of each deflecting electrode may be 45° or smaller.

A gap between the deflecting electrode and the floating electrode may be smaller than a size of the deflecting electrode, and the floating electrode and the deflector may be formed using an MEMS fabrication process.

In order to accomplish the objects of the invention, another aspect provides a micro-electron optical column including an electron emission source, a source lens, a focusing lens, the deflector according to the former aspect, and an electron beam aligner.

The deflector according to the invention is structurally stable like a conventional octupole deflector and has a simple driving system like a conventional quadrupole deflector while having good characteristics and performance.

DETAILED DESCRIPTION OF THE INVENTION

Figure 6:
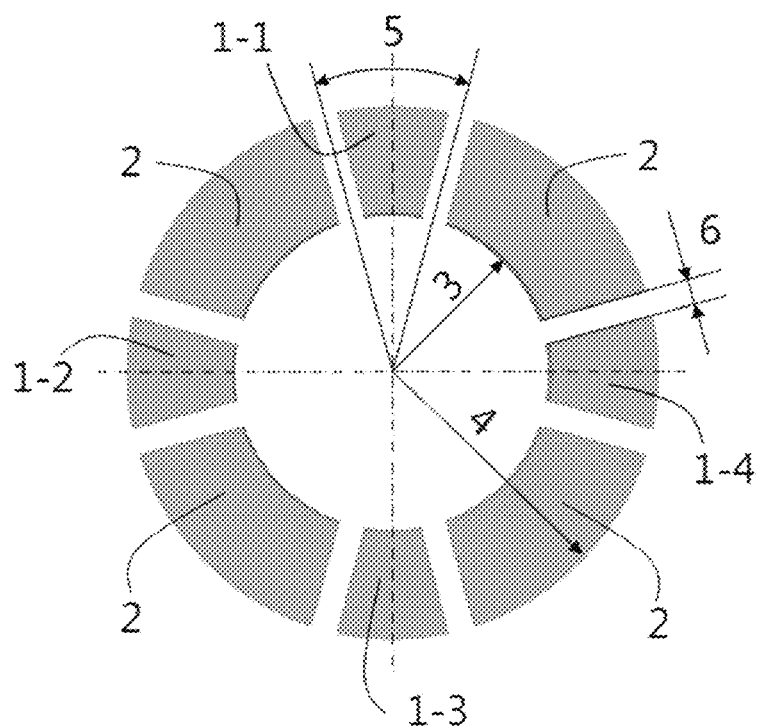
FIG. 6 is a plan view showing a structure of an electrostatic quadrupole deflector for a microcolumn according to one embodiment of the present invention.

A preferred embodiment of the present invention to improve deflection characteristics of a deflector for a microcolumn provides a quadrupole deflector that is shown in FIG. 6. The quadrupole deflector for a microcolumn according to the preferred embodiment appears to be similar to a conventional octupole deflector in terms of appearance but is different in driving method of deflecting an electron beam. That is, four deflecting electrodes 1-1, 1-2, 1-3, and 1-4 are used to deflect an electron beam, and floating electrodes 2 are interposed between respective deflecting electrodes in an alternate manner, with a predetermined gap 6 between a deflecting electrode and a floating electrode.

A deflector according to the preferred embodiment of the invention will be described with reference to FIG. 6. Arc-shaped deflecting electrodes 1 are radially arranged by cutting a doughnut-shaped plate into pieces. That is, four deflecting electrodes 1 are arranged around an electron beam passage hole 3 in a radial pattern. In the embodiment of FIG. 6, four deflecting electrodes 1-1, 1-2, 1-3, and 1-4 are symmetrically arranged at a right angle to each other. The four deflecting electrodes 1-1, 1-2, 1-3, and 1-4 are hereinafter referred to as an upper deflecting electrode 1-1, a left deflecting electrode 1-2, a lower deflecting electrode 1-3, and a right deflecting electrode 1-4. The floating electrodes 2 are interposed between the deflecting electrodes in an alternate manner. The width of the deflecting electrodes equals a difference between an inner radius of the deflector that is a radius of the electron beam passage hole 3 and an outer radius of the deflector. The length 5 of the deflecting electrodes is determined by an "angle θ between both side edges" (referred to as "arc angle") of each deflecting electrode. The thickness of the deflecting electrodes 1 is almost the same as existing deflecting electrodes. A gap 6 (or d) between the floating electrode 2 and the deflecting electrode 1 is determined to a size by which electric current cannot flow between the floating electrode 2 and the deflecting electrode 1. That is, the gap is preferably so wide that electricity cannot be carried. Surface portions of the deflecting electrode 1 and the floating electrode 2 are made of a conductive material. That is, the surface portions of deflecting electrode 1 and the floating electrode 2 are made of a material that can affect an electron beam that passes through the electron beam passage hole 3 when a voltage is externally applied. Preferably, the material may be a conductor or a doped semiconductor. Conveniently, the deflecting electrode 1 and the floating electrode 2 are made of a same material.

Figure 1:
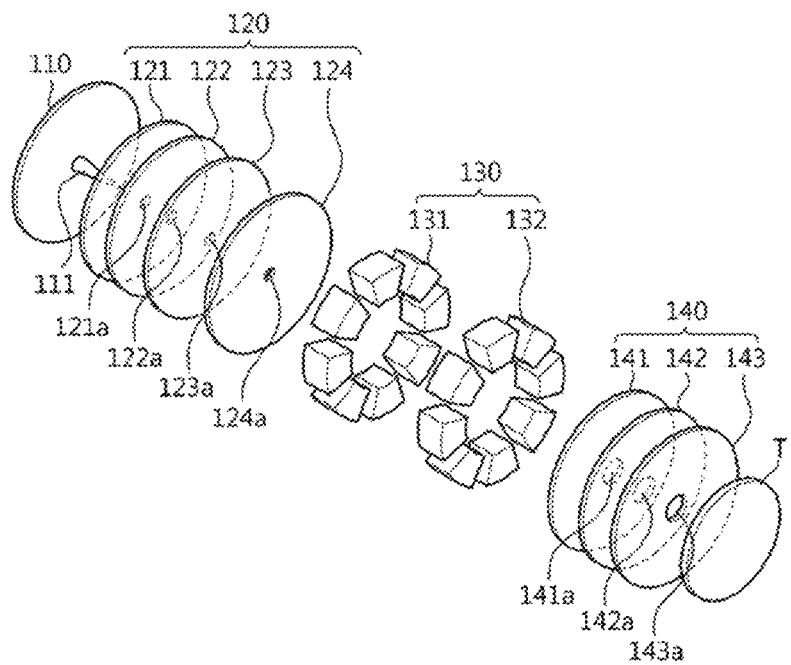
FIG. 1 is a perspective view showing a structure of a micro-electron optical column according to a first related art.
Figure 2:
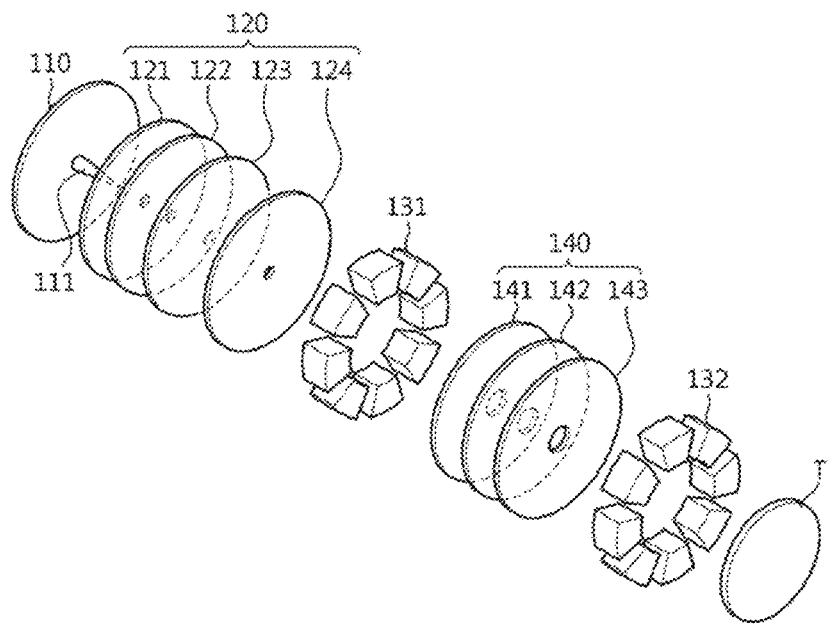
FIG. 2 is a perspective view showing a structure of a micro-electron optical column according to a second related art.
Figure 3:
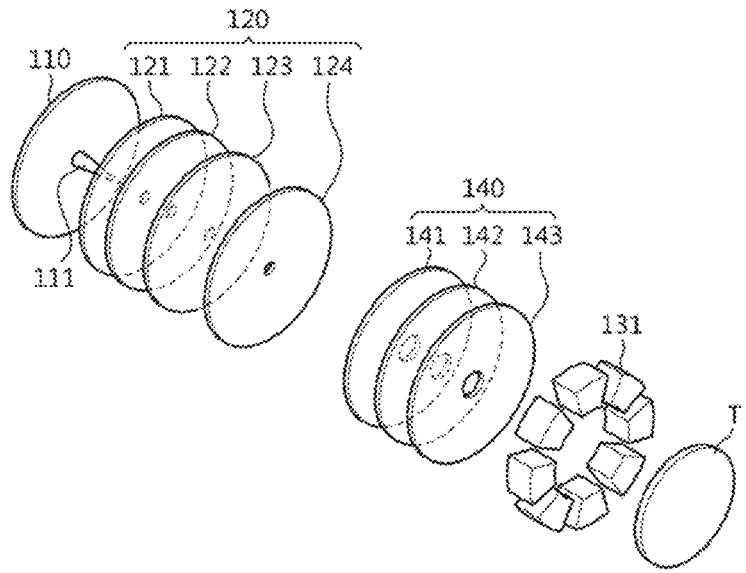
FIG. 3 is a perspective view showing a structure of a micro-electron optical column according to a third related art.
Figure 4:
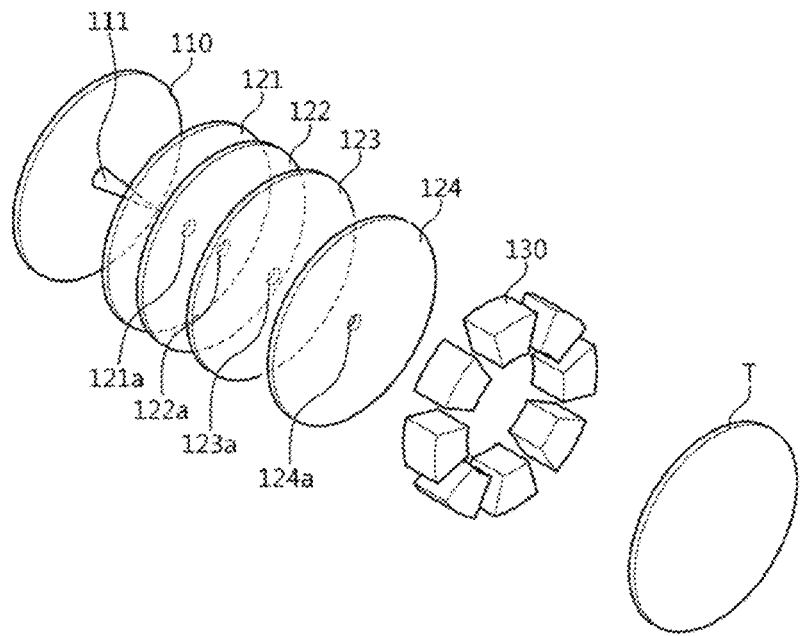
FIG. 4 is a perspective view showing a structure of a micro-electron optical column according to a fourth related art.
Figure 5:
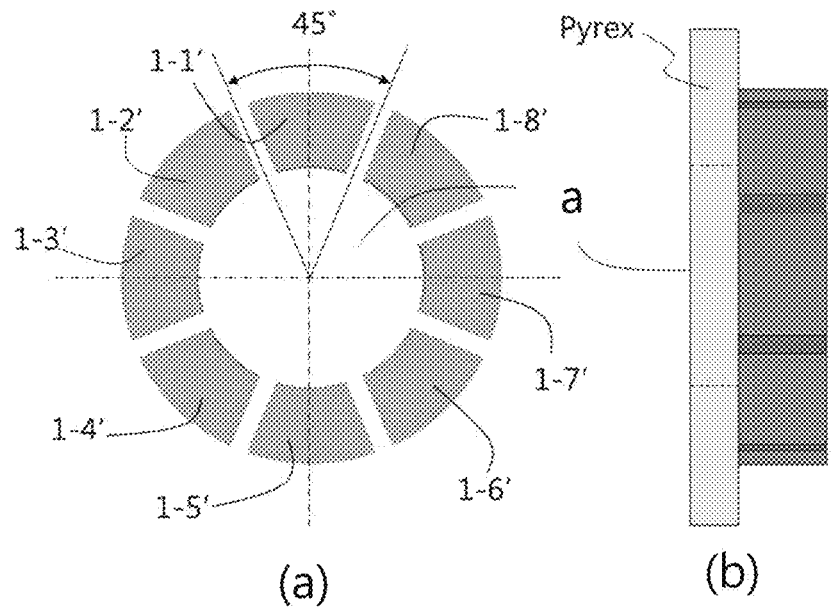
FIGS. 5A and 5B are respectively a plan view and a side view of an octupole deflector according to a related art.

A key feature of the present invention is to arrange the floating electrodes 2 between the deflecting electrodes 1 in an alternating manner. In the octupole deflector according to the related art shown in FIGS. 5A and 5B, a deflection voltage is applied to upper, lower, left and right electrodes 1-1', 1-3', 1-5', and 1-7' among identical deflecting electrodes but electrodes 1-2', 1-4', 1-6', and 1-8' that are alternately disposed between the upper, lower, left, and right electrodes 1-1', 1-3', 1-5', and 1-7' are in a floating state.

As shown in FIG. 6, the deflecting electrodes 1 according to the preferred embodiment of the present invention are preferably smaller than the floating electrodes 2. In addition, the deflecting electrodes 1 are preferably formed to be smaller than the floating electrodes 2 such that an angle between side edges of each deflecting electrode 1 (an arc angle of each deflecting electrode 1) is smaller than an angle between side edges of each floating electrode 2 (an arc angle of each floating electrode 2).

In the deflector according to the preferred embodiment of the present invention, the number of the deflecting electrodes 1 is preferably four (4). In addition, the four floating electrodes 2 having a larger arc angle (see 5 in the drawing) than the deflecting electrodes 1 are respectively arranged between the deflecting electrodes 1 in an alternating manner. The number of the deflecting electrodes may be determined according to needs. In this case, as the floating electrodes 2 are alternately arranged between the deflecting electrodes 1, the present invention can increase an area of the floating electrode 2 that is in contact with the electron beam passage hole through which an electron beam passes.

Figure 7:
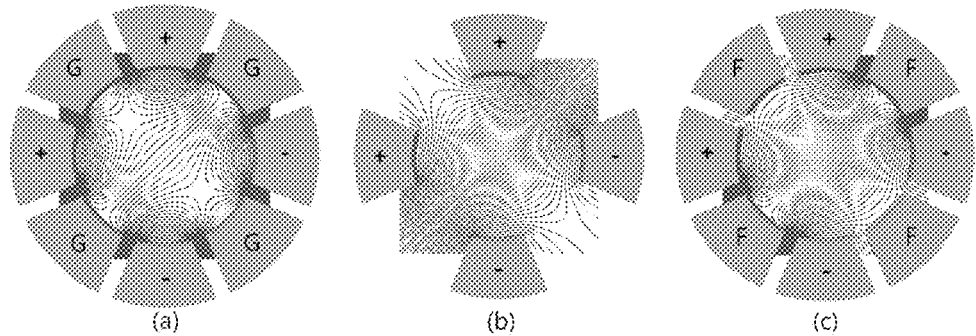
FIGS. 7A to 7C are diagrams showing distribution characteristics of equipotential lines according driving methods when a deflector in which an arc angle θ of each deflecting electrode is 45° is used.

The structure and operational characteristics of the deflector according to the present invention will be described below in detail. Distribution characteristics of equipotential lines according to driving method when a deflector in which an arc angle θ of a deflecting electrode is 45° is used will be described with reference to FIGS. 7A to 7C. The deflector shown in FIG. 7A is a conventional octupole deflector having identical deflecting electrodes. The deflector shown in FIG. 7B is a conventional quadrupole deflector. The deflector shown in FIG. 7C is a quadrupole deflector according to an embodiment of the present invention. In the deflector shown in FIG. 7A, a deflection voltage is applied only to upper, lower, left, and right electrodes 1-1', 1-3', 1-5', and 1-7', and the other electrodes 1-2', 1-4', 1-6', and 1-8' are grounded. With reference to values of numerical analysis on distribution characteristics of equipotential lines, it can be known that distribution characteristics of equipotential lines are different as illustrated in FIGS. 7A to 7C.

As shown, the quadrupole structure (deflector) according to the embodiment of the present invention is different from the conventional deflectors in that a deflecting electrode is smaller than a floating electrode F as well as in driving method. The area of the floating electrode F that is in contact with an electron beam passage hole is larger than that of the deflecting electrode.

Figure 8:
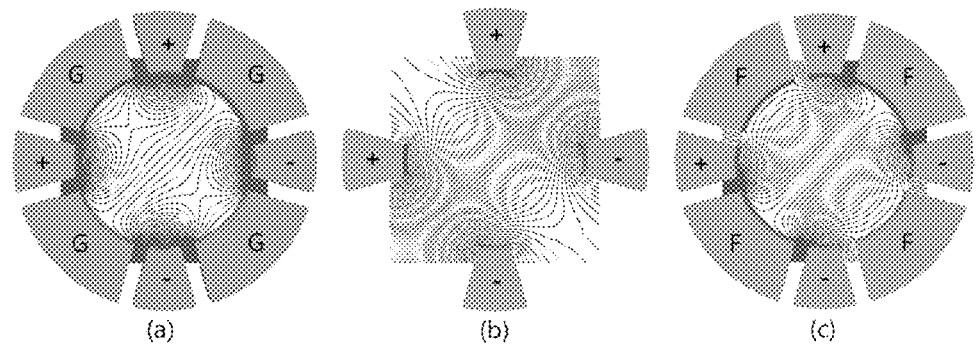
FIGS. 8A to 8C are diagrams showing distribution characteristics of equipotential lines according to driving methods when the size of a deflecting electrode is reduced compared to that of FIGS. 7A to 7C.

The structures of FIGS. 8A, 8B, and 8C are different from the structures of FIGS. 7A, 7B, and 7C, respectively in the following points: the area of grounded electrodes of FIG. 8A is increased compared to that of FIG. 7A; the area of deflecting electrodes of FIG. 8B is decreased compared to that of FIG. 7B; and the area of floating electrodes of FIG. 8C is increased compared to that of FIG. 7C. With reference to the results of numerical analysis, it is possible to obtain distribution characteristics of equipotential lines shown in FIGS. 8A to 8C according to driving methods and sizes of the deflecting electrode.

Figure 9:
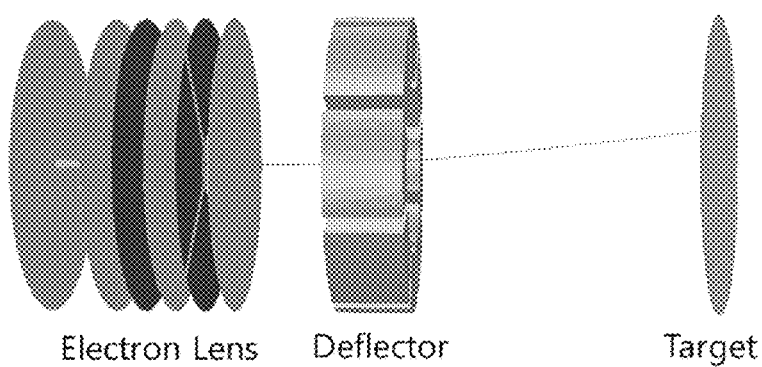
FIG. 9 is a perspective view showing deflection of an electron beam in a microcolumn according to an embodiment of the present invention.
Figure 10:
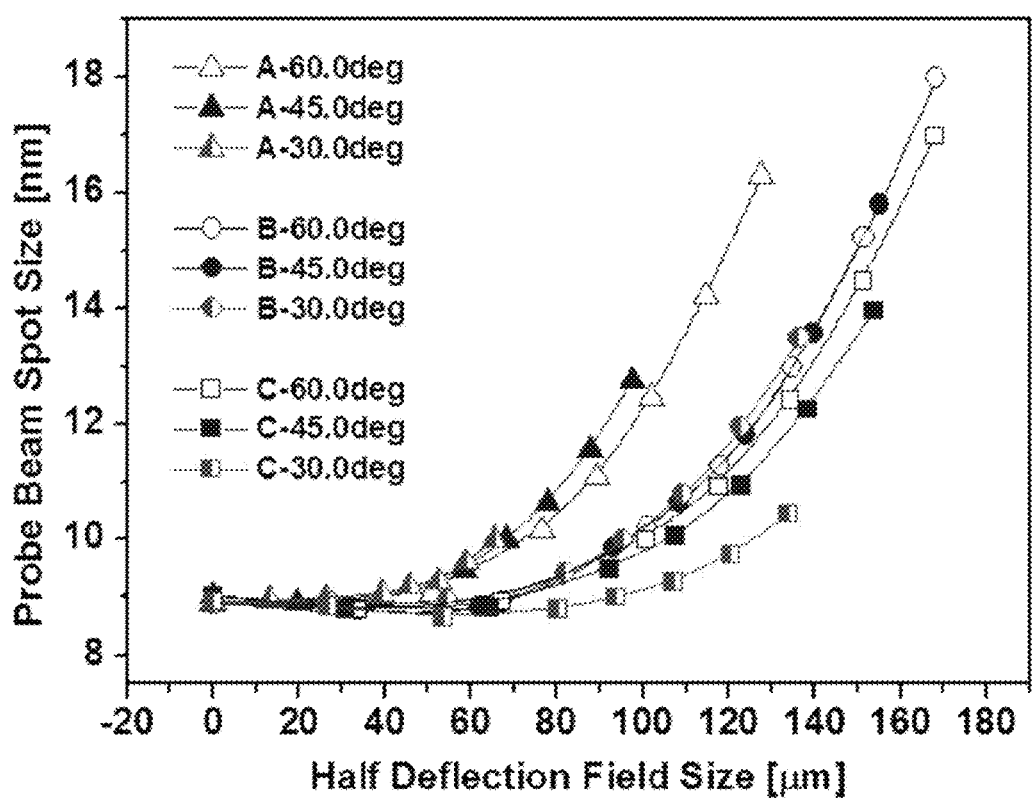
FIG. 10 is a graph showing deflection characteristics according to driving methods and structures of a deflector for a microcolumn.

FIG. 9 is a conceptual perspective view showing deflection of an electron beam by a deflector. FIG. 10 is a simulation result of numerical analysis when the deflectors of FIGS. 7A to 7C and 8A to 8C are applied to a microcolumn. When making comparison in terms of driving method, i.e. the absence and presence of the floating electrode, it is known that an increase ratio in a spot size of an electron beam at the center of a target with respect to a spot size of an electron beam at the periphery of the target is smaller in the case of using the deflector according to the invention compared to the case of using the conventional octupole deflector driven by a simple driving method or the conventional quadrupole deflector composed of four electrodes. In terms of the size of the deflecting electrode, in the case of the conventional octupole deflector, when the sizes of the upper, lower, left, and right deflecting electrodes 1-1, 1-3, 1-5, and 1-7 are increased (in other words, the arc angles of the deflecting electrodes 1-1, 1-3, 1-5, and 1-7 are increased from 30° to 60°) an increase ratio in the spot size of an electron beam at the periphery of the target with respect to that at the center of the target slightly is slightly reduced. Meanwhile, in the case of using the deflector according to the present invention, when the size of the deflecting electrodes are decreased (i.e., the arc angles of the deflecting electrodes are decreased from 60° to 30°), an increase ratio in the spot size of an electron beam at the periphery of a target with respect to that at the center of the target is significantly reduced.

In FIG. 10, plots A indicate data for the conventional octupole deflector, plots B indicate data for the conventional quadrupole deflector, and plots C indicate data for the deflector according to the present invention. With reference to the simulation results of numerical analysis, comparison is made in terms of effective deflection field size that ranges from the center of a target to a position at which an electron beam spot size is 20% larger than a spot size of a non-deflected electron beam. From the result, it is known that: the effective deflection field size of about 170 μm when an arc angle of the deflecting electrode is 60° in the conventional octupole deflector system; the effective deflection field size is not significantly affected by the arc angle of the deflecting electrode and the effective deflection field size is about 220 μm when the arc angle of the deflecting electrode is 60° in case of the conventional quadrupole deflector system. Meanwhile, in the case of the deflector system according to the present invention, the effective deflection field size is the most sensitively affected by the arc angle of the deflecting electrode and the effective deflection field size is about 270 μm when the arc angle is 30°. That is, the result of the numerical analysis shows that the effective deflection field size is largest in the case of the deflector according to the present invention.

The deflector also functions to align the path of an electron beam. The deflector with the floating electrode according to the present invention can align the path of an electron beam by separately setting an initial setting voltage. In addition, an electron beam aligner that is needed to align the path of an electron beam can be added. Preferably, the electron beam aligner may be arranged at a preceding stage to an aperture grid of electron lenses of a micro-electron column.

What is claimed is:

1. An electrostatic quadrupole deflector for a microcolumn, comprising:
   an electron passage hole through which an electron beam passes;
   a plurality of deflecting electrodes that is arranged in a radial pattern around the electron passage to deflect or scan the electron beam; and
   a plurality of floating electrodes that is arranged between the deflecting electrodes in an alternating manner in a radial pattern around the electron passage without a connection with the ground and to which any voltage is not applied to the plurality of floating electrodes while the deflection voltage is applied to the deflecting electrodes,
   wherein the electron passage hole and the floating electrodes are arranged as a layer.

2. The deflector according to claim 1, wherein the deflecting electrode is smaller than the floating electrode.

3. The deflector according to claim 1, wherein the deflecting electrodes are four in number and are symmetrically arranged.

4. The deflector according to claim 3, wherein an angle θ between both side edges (referred to as "arc angle") of each deflecting electrode is 45° or smaller.

5. The deflector according to claim 1, wherein a gap between the deflecting electrode and the floating electrode is smaller than a size of the deflecting electrode, and wherein the deflector is formed using an MEMS fabrication process.

6. The deflector according to claim 2, wherein a gap between the deflecting electrode and the floating electrode is smaller than a size of the deflecting electrode, and wherein the deflector is formed using an MEMS fabrication process.

7. The deflector according to claim 4, wherein a gap between the deflecting electrode and the floating electrode is smaller than a size of the deflecting electrode, and wherein the deflector is formed using an MEMS fabrication process.

8. A micro-electron optical column, comprising:
an electron emission source;
a source lens;
a focusing lens;
the deflector according to claim 1; and
an electron beam aligner.

9. A micro-electron optical column, comprising:
an electron emission source;
a source lens;
a focusing lens;
the deflector according to claim 2; and
an electron beam aligner.

10. A micro-electron optical column, comprising:
an electron emission source;
a source lens;
a focusing lens;
the deflector according to claim 3; and
an electron beam aligner.

11. A micro-electron optical column, comprising:
an electron emission source;
a source lens;
a focusing lens;
the deflector according to claim 4; and
an electron beam aligner.

12. A micro-electron optical column, comprising:
en electron emission source;
a source lens;
a focusing lens;
the deflector according to claim 5; and
an electron beam aligner.

13. A micro-electron optical column, comprising:
an electron emission source;
a source lens;
a focusing lens;
the deflector according to claim 6; and
an electron beam aligner.

14. A micro-electron optical column, comprising:
an electron, emission source;
a source lens;
a focusing lens;
the deflector according to claim 7; and
an electron beam aligner.

* * * * *